(12) United States Patent
Mears et al.

(10) Patent No.: US 6,426,616 B1
(45) Date of Patent: Jul. 30, 2002

(54) PHASING AND INDICATOR ARRANGEMENTS FOR SWITCHGEAR OR THE LIKE

(75) Inventors: Gregory C. Mears, Chicago; Brian P. Mugalian, Evanston, both of IL (US)

(73) Assignee: S&C Electric Co., Chicago, IL (US)

( * ) Notice: Subject to any disclaimer, the term of this patent is extended or adjusted under 35 U.S.C. 154(b) by 0 days.

(21) Appl. No.: 09/211,490

(22) Filed: Dec. 15, 1998

Related U.S. Application Data

(60) Division of application No. 08/788,158, filed on Jan. 24, 1997, now Pat. No. 5,910,775, which is a continuation-in-part of application No. 08/705,460, filed on Aug. 29, 1996, now Pat. No. 5,864,107.

(51) Int. Cl.[7] .................. G01R 23/00; G01R 13/02; G08B 5/00; G09F 9/00
(52) U.S. Cl. .................. 324/76.52; 324/76.55; 340/815.4; 340/815.44
(58) Field of Search .......... 324/76.52, 76.55, 324/76.58, 76.59, 76.61, 76.77, 76.82, 76.86; 340/815.4, 815.44, 660, 661

(56) References Cited

U.S. PATENT DOCUMENTS

| | | | | |
|---|---|---|---|---|
| 2,960,657 A | * | 11/1960 | Edgerly ............... | 340/660 |
| 3,745,549 A | * | 7/1973 | Jepperson et al. .... | 340/660 |
| 4,879,509 A | * | 11/1989 | Sometani et al. .... | 324/108 |
| 5,521,567 A | * | 5/1996 | Devonald, III et al. | 361/200 |
| 5,537,041 A | * | 7/1996 | Candy ................. | 324/329 |
| 5,619,133 A | * | 4/1997 | Shank et al. ......... | 324/207.24 |
| 5,751,219 A | * | 5/1998 | Stegmueller .......... | 324/555 |
| 5,864,107 A | * | 1/1999 | French et al. ........ | 361/200 |
| 5,910,775 A | * | 6/1999 | Mears et al. ......... | 324/537 |
| 6,040,538 A | * | 3/2000 | French et al. ........ | 361/600 |
| 6,114,642 A | * | 9/2000 | French et al. ........ | 361/600 |
| 6,163,265 A | * | 12/2000 | Klippel ............... | 324/522 |

OTHER PUBLICATIONS

ELSIC Catalog Sheets, 4 pages, date unknown.

* cited by examiner

*Primary Examiner*—Michael J. Sherry
*Assistant Examiner*—Jermele M. Hollington
(74) *Attorney, Agent, or Firm*—James V. LaPacek

(57) ABSTRACT

A phasing and indicator arrangement is provided for switchgear or the like that responds to electrical sources and provides voltage indicator functions, phasing determinations, and self-test features. Phasing provisions are responsive to two or more voltage sensors proximate respective electrical sources to provide an output that represents the phase difference, i.e. time relationship, between the electrical sources as an alternating-current voltage measurable by a voltmeter. The output is relatively independent of the voltage of the electrical sources. The indicator arrangement is operable in a test mode to test the integrity of one or more voltage indicators while clearly identifying that the indicator arrangement is in a test mode. In a preferred arrangement, the indicator arrangement in the self-test mode is powered by a photocell. Further, in the self-test mode, the indicator arrangement generates signals through each voltage sensor and over the complete voltage sensing path, the generated signals being substantially similar to the signals generated by each voltage sensor during normal operation in response to an alternating-current source. In the self-test mode, the phasing arrangement is also tested.

2 Claims, 4 Drawing Sheets

PHASING AND INDICATOR ARRANGEMENTS FOR SWITCHGEAR OR THE LIKE

CROSS REFERENCE TO RELATED APPLICATION

This application is a divisional of application Ser. No. 08/788,158 filed on Jan. 24, 1997, now U.S. Pat. No. 5,910,775, which is a continuation-in-part application of application Ser. No. 08/705,460, filed on Aug. 29, 1996, now U.S. Pat. No. 5,864,107.

BACKGROUND OF THE INVENTION

1. Field of the Invention

The present invention relates generally to phasing and indicator arrangements for switchgear and the like in the field of electrical power distribution, and more particularly to an arrangement that facilitates phasing measurements with the use of conventional voltmeters and an indicating arrangement with desirable test features.

2. Description of the Related Art

In the field of electrical power distribution, it is a common practice to perform phasing measurements between various power cables to determine the phase difference between and the correct connection of the power cables throughout the system. Various prior art arrangements include indicator lights that respond to sensed voltage signals to indicate whether two signals are in phase or out of phase. For example, device types HOMPK and HO-PV are available from ELSIC, Trompeterallee, Germany. Further, page 14 of Merlin Gerin Publication AC0063/3E illustrates voltage indicator lamps and a phase concordance unit designated MX 403.

Additionally, various devices are known that respond to voltage sensors and that function as voltage indicators. An arrangement for testing the integrity of the voltage sensing system is shown in U.S. Pat. No. 5,521,567.

While these prior art arrangements may be useful to provide various indicator and phasing arrangements, the prior phasing arrangements are rather awkward to operate, require manipulation and interconnection of various components, require relatively expensive sensing devices, require the use of specialized meters or devices, and/or require external power supplies. Further, the prior indicator arrangements require separate power supplies for testing and do not provide simplified unambiguous self-testing functions.

SUMMARY OF THE INVENTION

Accordingly, it is a principal object of the present invention to provide an arrangement that is responsive to a voltage sensor and determines phase information that is measurable with a voltmeter.

It is another object of the present invention to provide a method to verify phasing between different electrical sources with the use of a voltmeter and such that the phasing determination is independent of the source voltage.

It is a further object of the present invention to provide a phasing arrangement that is responsive to two or more alternating current sources and that provides phasing information as the AC voltage between outputs representing each of the two of the alternating-current sources.

It is yet another object of the present invention to provide a voltage indicator arrangement for an electrical source that includes a sensorially perceptible voltage indicator and a sensorially perceptible test indicator that clearly establishes a test mode of the voltage indicator arrangement.

It is an additional object of the present invention to provide a voltage indicator arrangement that is self-powered in a test mode by a photocell.

It is a still further object of the present invention to provide a voltage indicator arrangement that includes a test mode that tests the integrity of a voltage indicator utilizing substantially the same signal that is provided during normal operation.

These and other objects of the present invention are efficiently achieved by the provision of a phasing and indicator arrangement that responds to electrical sources and provides voltage indicator functions, phasing determinations, and self-test features.

Phasing provisions are responsive to two or more voltage sensors proximate respective electrical sources to provide an output that represents the phase difference, i.e. time relationship, between the electrical sources as an alternating-current voltage measurable by a voltmeter. The output is relatively independent of the voltage of the electrical sources.

The indicator arrangement is operable in a test mode to test the integrity of one or more voltage indicators while clearly identifying that the indicator arrangement is in a test mode. In a preferred arrangement, the indicator arrangement in the self-test mode is powered by a photocell. Further, in the self-test mode, the indicator arrangement generates signals through each voltage sensor and over the complete voltage sensing path, the generated signals being substantially similar to the signals generated by each voltage sensor during normal operation in response to an alternating-current source. In the self-test mode, the phasing arrangement is also tested.

BRIEF DESCRIPTION OF THE DRAWING

The invention, both as to its organization and method of operation, together with further objects and advantages thereof, will best be understood by reference to the specification taken in conjunction with the accompanying drawing in which.

DETAILED DESCRIPTION

Figure 1:
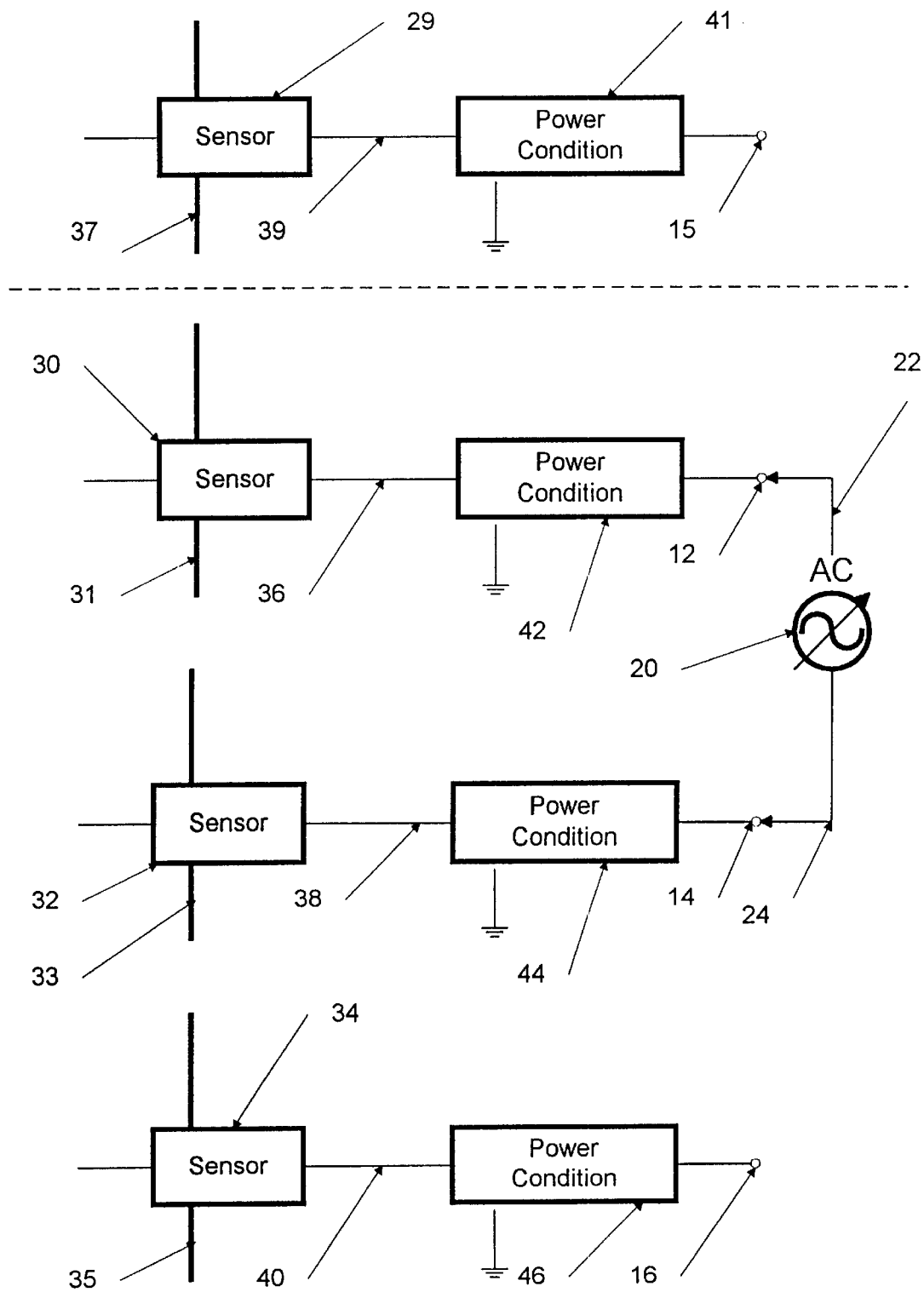
FIG. 1 is a block diagram representation of a phasing arrangement of the present invention.

Referring now to FIG. 1, the phasing arrangement 10 of the present invention provides phasing outputs at 12, 14, and 16, e.g. corresponding to a three-phase alternating-current electrical system. The outputs 12, 14 and 16 provide phase information that corresponds to each of the respective phases or electrical sources 31, 33 or 35 of the electrical system while being relatively independent of the voltage on each phase. An alternating-current voltmeter 20 with leads 22, 24 placed across two of the phasing outputs measures the phase difference, i.e. time relationship, e.g. as a voltage generally proportional to the phase difference.

The phasing arrangement 10 includes sensors 30, 32 and 34 that provide respective outputs 36, 38 and 40 which are proportional to the associated respective electrical source or phase line 31, 33 or 35 of the electrical system. Each of the outputs 36, 38 and 40 is connected to the input of a respective power conditioning stage 42, 44 and 46. In a specific embodiment, the outputs 36, 38 and 40 are high-impedance outputs such that the power conditioning stages 42, 44 and 46 isolate the high impedance outputs 36, 38, and 40 of the sensors 30, 32 and 34 and provide the phasing outputs 12, 14 and 16. In a specific embodiment, the outputs 36, 38 and 40 are sinusoidal waveforms representative of the electrical sources. The power conditioning stages 42, 44 and 46 convert each of the sinusoidal waveform outputs at 36, 38 and 40, via clamping action or the like, to waveforms at the phasing outputs 12, 14 and 16 that are substantially square waves.

Figure 2:
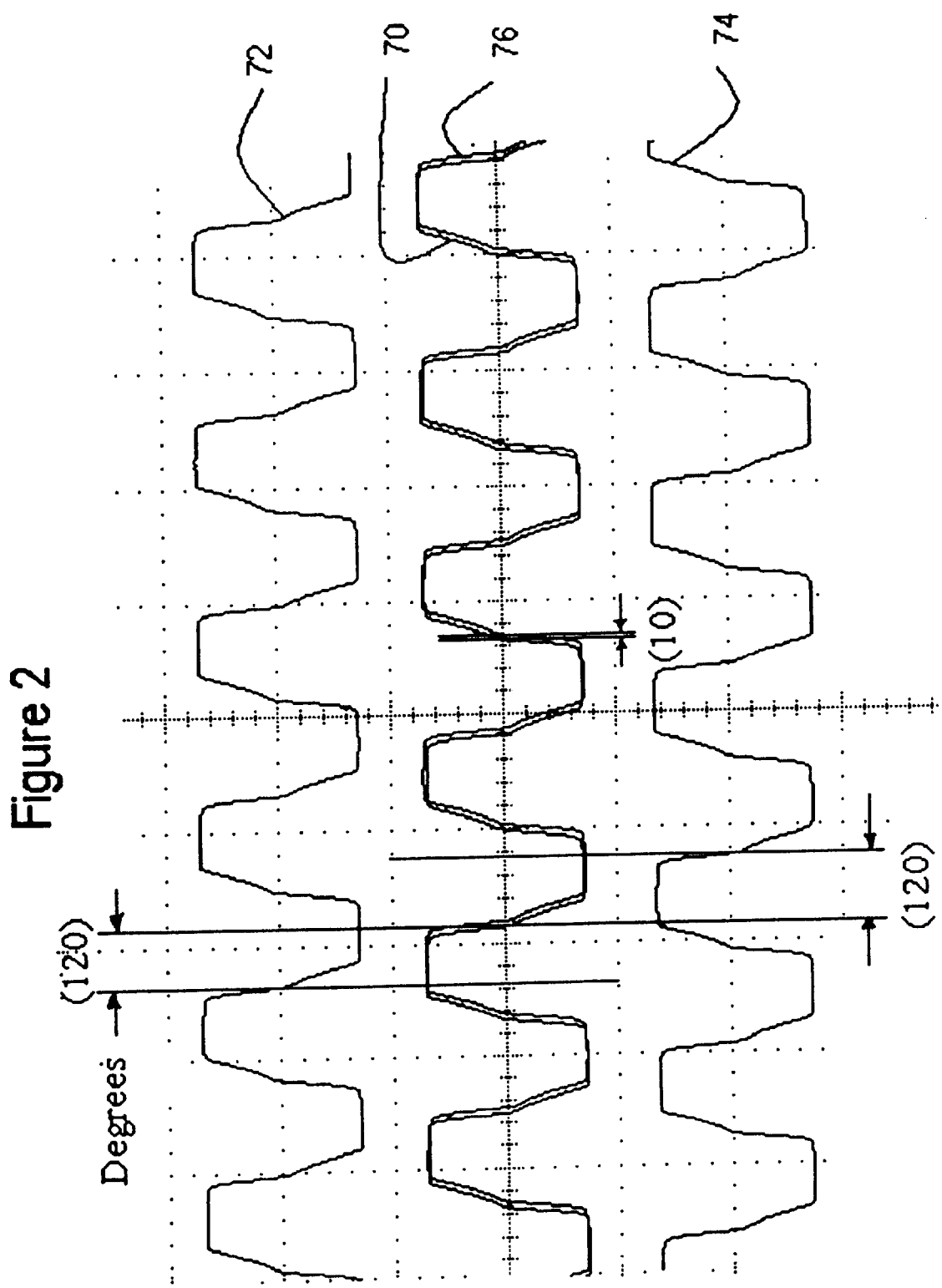
FIG. 2 is a diagrammatic representation of various signals in the phasing arrangement of FIG. 1.

With additional reference now to FIG. 2, the waveforms 70, 72 and 74 represent the signals at the respective phasing outputs 12, 14 and 16, the waveforms 70, 72 and 74 containing the phase information of the respective electrical sources or phase lines 31, 33 and 35 sensed by the respective sensors 30, 32 and 34.

The waveform 76 in FIG. 2 corresponds to a fourth phasing output 15 in FIG. 1 of another electrical source 37 sensed by a sensor 29 having an output 39 connected to a power conditioning stage 41, the power conditioning stage 41 providing the phasing output 15. For example, in a specific illustration, the electrical source 37 represents "phase one" of a "second way" or 3-pole circuit path of the electrical system while the electrical source 31 represents "phase one" of a "first way" or 3-pole circuit path.

Before connecting the electrical sources 31 and 37 together via a switch or the like, the phase relationship between the two sources 31 and 37 is determined or verified via measuring the voltage between the respective phasing outputs 12 and 15 which are represented by the respective waveforms 70 and 76. If the voltage difference measured on the AC voltmeter 20 is below a predetermined level, the electrical sources 31 and 37 of the two ways are suitable for connecting to the same bus. However, if the voltage difference is above a predetermined level establishing that a significant phase difference exists between the two sources, the two electrical sources should not be interconnected. Accordingly, in accordance with important aspects of the present invention, the phase difference between various electrical sources can be measured via the voltage between the corresponding phasing outputs.

As illustrated in FIG. 2, the two waveforms 70 and 76 (corresponding to electrical sources 31 and 37) are of relatively the same phase or time relationship and are thus suitable for interconnection. For example, if the two electrical sources 31 and 37 are exactly in phase, i.e. 0 degrees phase difference, then the voltage measured between the phasing outputs 12 and 15 would be essentially zero volts. On the other hand, the phase difference between the two electrical sources 31 and 33 is significant (as illustrated in FIG. 2 by waveforms 70 and 72). Thus these two electrical sources 31 and 33 are not suitable for interconnection, which can be ascertained via the measurement of the voltage differential between the corresponding phasing outputs 12 and 14. Specifically, as shown in FIG. 2, the two electrical sources 31 and 33 are approximately 120 degrees out of phase with respect to each other and in the example correspond to two different phases of the first way of the electrical system.

For illustrative purposes not to be interpreted in any limiting sense, it has been found that the phasing outputs operate in a desirable fashion for a voltage range of approximately 15–38 kv (phase-to-phase) AC and such that no calibration or adjustment is required to measure the phase differential using the phasing outputs, the magnitude of the waveforms in FIG. 2 being approximately 15 volts peak-to-peak. In a particular example, if the phasing output 12 to ground measures V1 to ground, the voltage from output 12 to output 14 is approximately V1 times the square root of 3. Further, the voltage differential between phasing outputs 12, 15 is less than (V1)/3 for the illustration where the waveforms 70, 76 are less than 10 degrees out of phase with respect to each other. As stated in other terms, the phasing arrangement 10 of the present invention establishes a voltage between the phasing outputs that characterizes or establishes a relationship between the measured AC voltage and the phase difference (time relationship) between the sensed electrical lines, i.e. a predetermined function between phase difference and voltage. As noted, it should also be understood that the phasing outputs 12, 14, 16 and 15 can also be utilized to verify the presence of voltage of the electrical sources, i.e. via the voltage measured phase to ground. It should also be understood that in specific embodiments of the present invention where additional accuracy of the phase differential measurement is desired, the power conditioning stages 41, 42, 44 and 46 include additional wave shaping circuitry to provide waveforms that are more accurately measured by AC voltmeters and the like.

Figure 3:
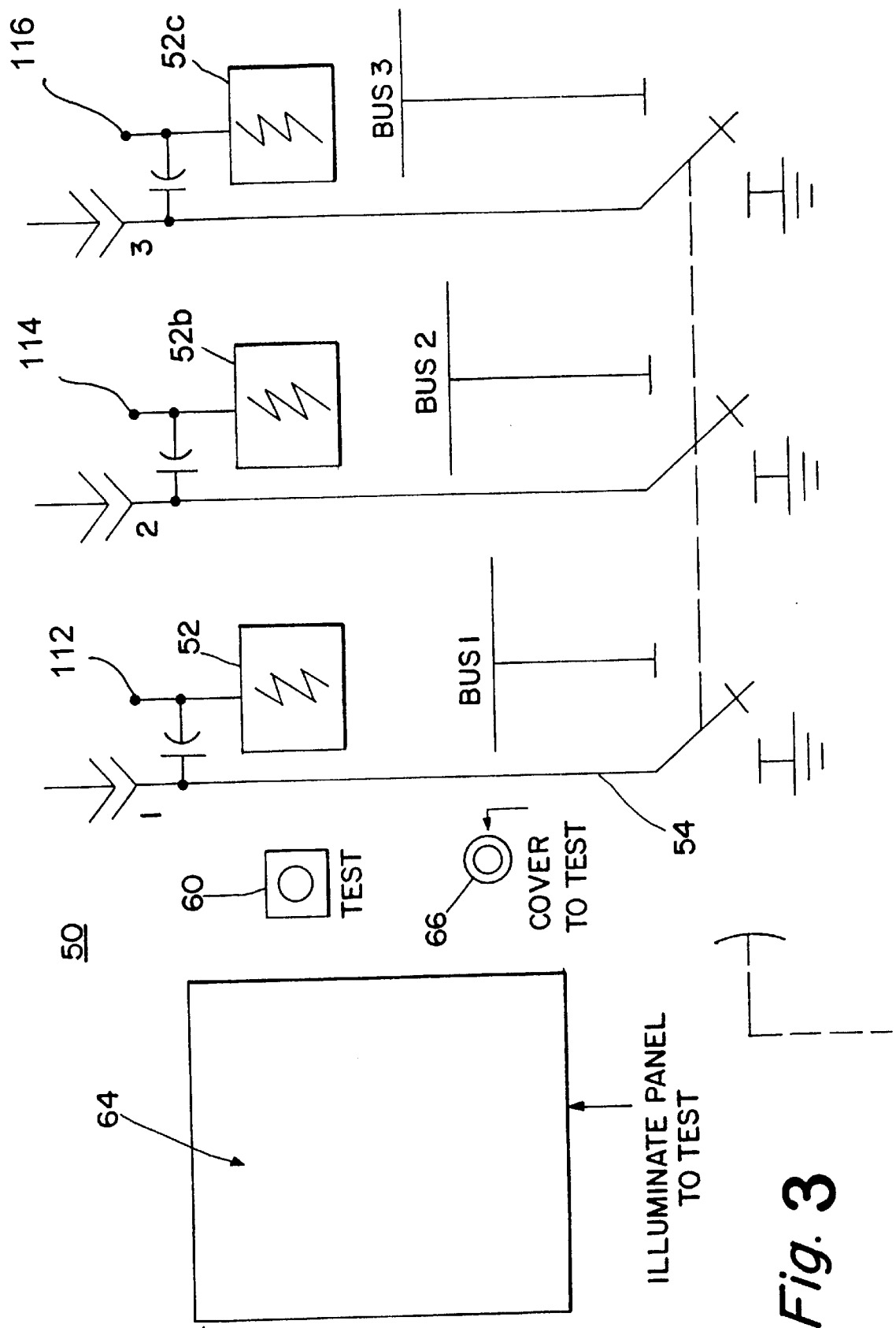
FIG. 3 is a diagrammatic representation of an indicator or display arrangement which utilizes the phasing arrangement of FIG. 1.
Figure 4:
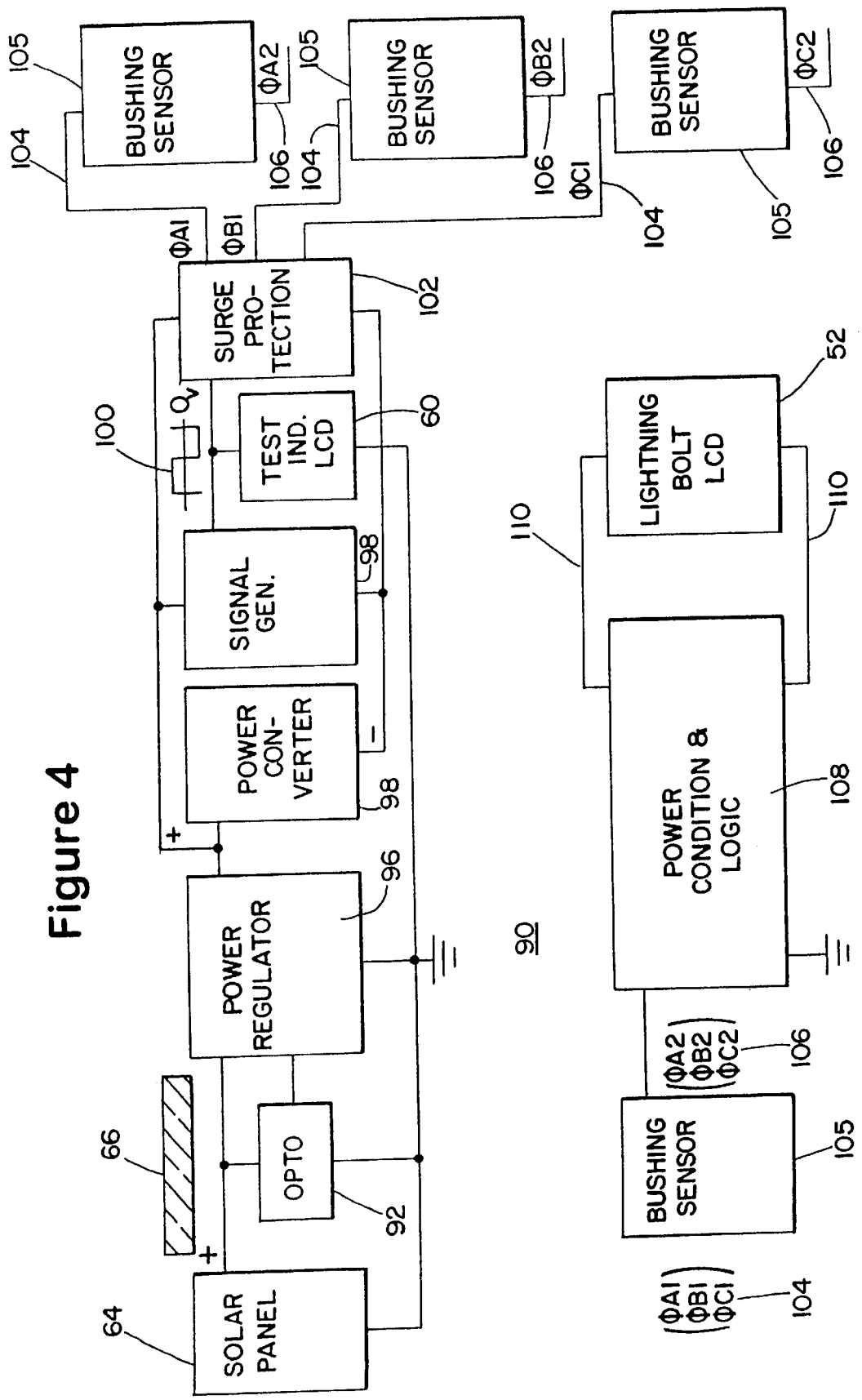
FIG. 4 is a block diagram electrical schematic diagram of portions of the indicator or display arrangement of FIG. 3.

Referring now additionally to FIGS. 3 and 4, in a specific embodiment, the phasing arrangement 10 is provided as an integral part of an indicator or display arrangement as represented by 50 in FIG. 3. In an illustrative embodiment, not to be interpreted in any limiting sense, the indicator arrangement 50 is utilized as the display panel referred to as item 40 in the aforementioned copending application Ser. No. 08/705,460, now U.S. Pat. No. 5,864,107 to provide information about the status of the circuit and components of the switchgear 20 shown in that application such as the energized/deenergized status of each pole of the overlied load interrupter switch or fault interrupter.

For example, as shown in FIG. 3, the indicator arrangement 50 includes, for each pole, a voltage indicator 52 and a line diagram 54 representing the electrical circuit and the load interrupter switch or fault interrupter (a load interrupter switch being illustrated in FIG. 3). A test indicator 60 and the voltage indicator 52 provide information on the operable status of the indicator arrangement 50 and the integrity of the voltage sensing system for each pole. Reference may be made to U. S. Pat. No. 5,521,567 for a further discussion of the testing of the integrity of the voltage sensing system. The phasing outputs 12, 14 and 16 are provided for each respective phase of the circuit illustrated at pins or posts 112, 114, and 116.

In the illustrative example of the indicator arrangement 50, the test indicator 60 displays a predetermined test symbol, e.g. a solid circle, when the indicator arrangement 50 is appropriately sequenced for testing. In the specific illustration, for testing purposes, a solar panel (i.e. photocell) 64 is provided to power the indicator arrangement 50. Additionally a test actuator 66 is provided that includes a transparent window over an optical switch at 92. The test sequence is actuated in response to the blocking of light to the optical switch at 92 while the solar panel 64 is illuminated sufficiently to provide power to actuate the indicator arrangement 50 and test circuit. Thus, after the user covers the test actuator 66, the display of the test symbol in the test indicator 60 provides assurance that the indicator arrangement 50 is appropriately powered up and fully functioning.

With the test indicator displayed at 60, the user may then ascertain the operability of each voltage indicator 52 and the integrity of the voltage sensing circuit for that corresponding pole. Thus, the presence of the test symbol at 60 and the three voltage indicators at 52 assure that the overall voltage sensing system is functioning appropriately.

In a specific embodiment, the voltage indicator 52 flashes the energized symbol, e.g. lightning bolt or the like, in the test mode to verify that the voltage indicator 52 is functional and the voltage sensing circuit is fully functional and reliable. Following this test function, i.e. after the operator unblocks the transparent window over the optical switch at 66, the energized/deenergized status of each pole may then be ascertained via the status of the voltage indicator 52 provided for each respective pole, for example 52b and 52c for the respective second and third poles of the indicator arrangement 50. In a specific embodiment, while the voltage indicators 52 are arranged for normal functioning, the operator before relying on the absence of an energized symbol at the voltage indicator 52, activates the testing mode of the indicator arrangement via the feature at 66 and observes the test symbol at 60 and checks for the presence of the energized symbols at 52a, 52b and 52c to determine proper operation. Without such appropriate testing, the voltage indicators 52 in themselves would function only as ordinary indicators as found in the prior art.

Referring now additionally to FIG. 4, the testing circuit 90 of the indicator arrangement 50 is powered by the solar panel 64 and actuated by the test actuator feature at 66. When the optical switch 92 is turned off by the blocking of light at 66, the optical switch 92 via path 94 activates a power regulator stage 96. The power regulator stage 96 supplies power to the power converter and signal generator stages referred to at 98 which actuate the test indicator 60 with a suitable alternating wave signal at 100. The alternating wave signal at 100 via a surge protection stage 102 provides signals for each phase at 104 which are connected to the sensors 30, 32 and 34. This signal path tests the integrity of the overall sensing circuit. If the sensing path is fully functioning, the signal will be returned at 106 on the lines from the bushing sensors 30, 32 and 34. The signal at 106 is then processed by a power condition and logic stage 108 which provides protection and the desired indicator waveform at 110 to drive the voltage indicator 52, e.g. a flashing signal.

Accordingly, the testing circuit 90 of the indicator arrangement 50 when actuated by the test actuator feature at 66 checks the integrity of the signal paths from the sensor and activates the voltage indicators at 52 to also test the integrity of the voltage indicators 52. As discussed hereinbefore, if any of the voltage indicators 52 are not actuated during the testing mode with the testing indicator 60 actuated, the operator is alerted that the voltage indicators 52 are not working and not to be relied upon.

The power condition and logic stage 108 also is arranged to provide appropriate phasing signals at the phasing outputs 12, 14 and 16 as explained hereinbefore, such that the phasing outputs provide phasing information that is independent of the sensed voltage levels and such that an alternating-current voltmeter may be utilized to measure the phase difference between the phases or electrical sources 31, 33 or 35 of the electrical system. It should also be noted that the phasing outputs 12, 14 and 16 are also tested in the test mode of the indicator arrangement 50, i.e. in the test mode, each of the phasing outputs 12, 14 and 16 develop a voltage to ground that can be measured using the AC voltmeter 20.

For illustrative purposes not to be interpreted in any limiting sense, it has been found that the indicator arrangement 50 along with the phasing outputs operates in a desirable fashion for a voltage range of approximately 4–38 kv (phase-to-phase) AC and such that no calibration or adjustment is required to provide the indicator functions and testing and also to measure the phasing outputs.

While there have been illustrated and described various embodiments of the present invention, it will be apparent that various changes and modifications will occur to those skilled in the art. Accordingly, it is intended in the appended claims to cover all such changes and modifications that fall within the true spirit and scope of the present invention.

What is claimed and desired to be secured by Letters Patent of the United States is:

1. A method for determining the phase relationship between two or more alternating current signals comprising the steps of:

sensing each of the alternating current signals to develop sensed output signals;

transforming the sensed output signals into respective substantially square-wave signals that are substantially independent of the magnitude of the alternating-current signals but that substantially accurately represent the phase relationships of the alternating current signals; and determining the phase relationship between the alternating-current signals on the basis of the alternating-current voltage measured between the substantially square-wave signals.

2. A method for verifying the phase relationship between two alternating-current signals comprising the steps of:

providing first and second signals as respective high-impedance, voltage-dependent signals representative of each of the alternating-current signals;

clamping each of the first and second signals to provide third and fourth signals that substantially accurately represent the respective phase information of the first and second signals; and determining the phase difference between the alternating-current signals via the third and fourth signals by measuring the alternating-current voltage between the third and fourth signals.

* * * * *